United States Patent [19]

Iyer et al.

[11] Patent Number: 5,478,599
[45] Date of Patent: Dec. 26, 1995

[54] PROCESS FOR RESIN IMPREGNATION OF A FIBROUS SUBSTRATE

[75] Inventors: Shridhar R. Iyer, Sugar Land; C. David Shirrell, Katy, both of Tex.

[73] Assignee: Shell Oil Company, Houston, Tex.

[21] Appl. No.: 417,479

[22] Filed: Apr. 5, 1995

Related U.S. Application Data

[63] Continuation of Ser. No. 174,735, Dec. 29, 1993, abandoned.

[51] Int. Cl.$^6$ ........................................ B05D 1/28
[52] U.S. Cl. ..................... 427/355; 427/345; 427/356; 427/428; 118/104; 118/204; 118/244; 118/261
[58] Field of Search ..................... 427/355, 356, 427/358, 428, 345; 118/100, 104, 261, 244, 204

[56] References Cited

U.S. PATENT DOCUMENTS

| | | | |
|---|---|---|---|
| 2,252,345 | 8/1941 | Johnson | 427/356 |
| 2,534,320 | 12/1950 | Taylor | 427/356 |
| 3,354,867 | 11/1967 | Pomper et al. | 118/104 |
| 4,478,869 | 10/1984 | Brady et al. | 427/186 |
| 4,657,783 | 4/1987 | Tatt et al. | 118/227 |

FOREIGN PATENT DOCUMENTS 0476752  3/1992  European Pat. Off. .

OTHER PUBLICATIONS

Encyclopedia of Chemical Technology, 3rd ed., "Coating Processes", pp. 386–426, 1979.

*Primary Examiner*—Shrive Beck
*Assistant Examiner*—Brian K. Talbot

[57] ABSTRACT

A process is described for minimizing resin waste in the impregnation of a fibrous substrate with a thermosettable resin. The process involves the use of resin application means comprising a rotatable roller on which is deposited a liquid-form thermosettable resin; passing a fibrous substrate in countercurrent contact with the thermosettable resin on the rotating roller so as to transfer the thermosettable resin to the fibrous substrate; removing any untransferred resin from the rotating roller and depositing the removed resin onto the fibrous substrate prior to contact thereof with the rotating roller; and passing the resin-containing fibrous web to a heating zone to partially cure the resin. The process is particularly suited for application of a solventless resin formulation to a glass web in the preparation of a prepreg for an electrical laminate.

9 Claims, 1 Drawing Sheet

PROCESS FOR RESIN IMPREGNATION OF A FIBROUS SUBSTRATE

This is a continuation of application Ser. No. 08/174,735, filed Dec. 29, 1993, now abandoned.

BACKGROUND OF THE INVENTION

This invention relates to the preparation of fiber-reinforced thermosettable resin articles. In a specific embodiment, the invention relates to a process and apparatus for reducing resin scrap in the impregnation of a glass substrate with a solventless thermosettable resin system.

The manufacture of the cured thermosettable resin base of an electronic circuit board begins with the impregnation of a fibrous glass substrate with a liquid thermosettable resin system. The resin-impregnated substrate is then partially cured to form a "prepreg." A set of layered prepregs is heated under pressure to fully cure the resin and to form a hard laminate, which serves as the base for electric circuitry.

Although there exist thermosettable resins, such as low molecular weight epoxy resins, which are liquid at room temperature, current circuit board requirements make it necessary to use high-performance resins systems which are solids or viscous liquids at room temperature and to apply the resins to the substrate in melt or solution form. Processing thermosettable resins in the melt, however, is difficult because the high temperatures necessary to melt the resin cause the resin to cure prematurely, resulting in poor "wet-out," or saturation of the substrate by the resin.

Current commercial processes for preparing prepregs apply the resin to the substrate using an organic solution of the resin. Solution processes must include a step, usually carried out in conjunction with partial curing of the resin, in which the solvent is removed from the prepreg by heating the solvent to its volatilization temperature. Such a process has a number of disadvantages: First, it requires the disposal or discharge of the organic volatiles. Second, volatilization of the solvent from the uncured resin can result in the presence of voids and irregularities in the prepreg and in the cured laminate. Furthermore, a considerable amount of time is required for the solvent removal step.

A process has been proposed for application of a solventless thermosettable resin to a glass web which involves depositing the solventless resin onto a rotating roller and passing the glass web in countercurrent contact with the deposited resin so as to transfer the resin to the web, which is then passed to a heating zone for partial curing of the resin. It has been found that this resin application process can produce an undesirably high amount of scrap resin as a result of retention of a certain mount of resin on the rotating roller.

It is therefore an object of the invention to provide an improved process for impregnation of a fibrous substrate with a solventless thermosettable resin system which reduces the quantity of scrap resin produced in the process.

SUMMARY OF THE INVENTION

According to the invention, a process is provided for impregnating a fibrous substrate with a thermosettable resin, the process comprising: providing resin application means comprising a rotating roller; depositing onto the rotating roller a liquid-form thermosettable resin formulation comprising an essentially uncured thermosettable resin; passing a fibrous substrate in countercurrent contact with the thermosettable resin formulation on the rotating roller so as to transfer the major portion of the thermosettable resin formulation to the fibrous substrate; removing any untransferred resin from the rotating roller and depositing said resin onto the fibrous substrate as the substrate approaches the rotating roller; and passing the resin-containing fibrous substrate to a heating zone to partially cure the resin and form a prepreg comprising the fibrous substrate and the partially-cured thermosettable resin.

DETAILED DESCRIPTION OF THE INVENTION

The invention process provides a technique for minimizing resin waste in the impregnation of a fibrous substrate with a liquid-form thermosettable resin. The process is particularly suitable for impregnating a glass web with a solventless resin system in the preparation of a prepreg for ultimate use in electrical laminates.

The process involves contacting a porous fibrous substrate with a liquid-form resin positioned on a rotating roller and transferring, by countercurrent contact, the resin from said roller to the fibrous substrate, and causing any unabsorbed resin to fall from said roller onto the advancing porous fibrous substrate prior to contact thereof with the rotating roller. The object of the resin application process of the invention is to achieve thorough wet-out of the substrate by the liquid resin while minimizing resin waste by directing any unabsorbed resin onto the porous substrate as the substrate approaches the rotating roller.

In the invention resin application process, a fibrous substrate is impregnated with a liquid-form thermosettable resin. Although the invention process can be practiced with solvent-borne resins, the preferred resin system for the invention process is one which does not contain an organic solvent, which includes both water-borne resin systems and solventless resin systems. For a solventless resin system, the liquid form can be achieved by use of a thermosettable resin which is a low-viscosity liquid at room temperature or which has been heated to a temperature effective to achieve sufficiently low viscosity for thorough wetout of the substrate. In the latter case, of course, the resin system (the thermosettable resin and any curing compounds used therewith) must not cure to any substantial degree at its melting temperature over the length of time of the substrate impregnation process.

Figure 1:
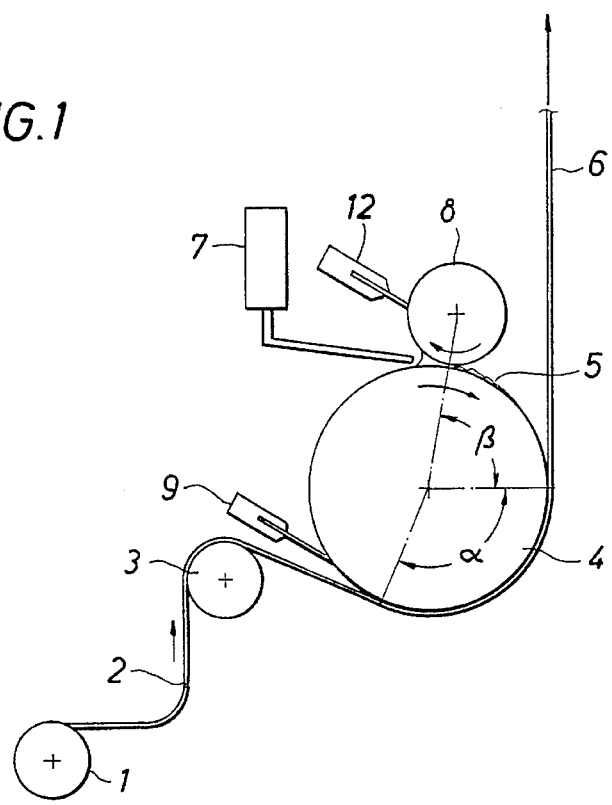
FIG. 1 is a cross-sectional diagram of the preferred embodiment of the invention resin application apparatus.

The invention resin application process and apparatus can be described by reference to FIG. 1. The substrate 2, generally any porous material in chopped, mat or woven form, preferably a web of woven glass fibers, is advanced from delivery means 1, which will generally including automatic means for advancing the web at a selected rate and with a selected web tension. The fibrous web is optionally heated by, for example, infrared heaters, prior to advancement to the resin application zone. Guiding means 3 is positioned to direct the web toward resin applicator roller 4 at an arc of contact α and to position the advancing web so as to receive any unabsorbed resin removed from the roller by doctor blade 9. Angle α can vary depending upon the overall configuration of the application scheme, but to achieve minimum resin waste will generally be within the range of about 45 to about 180 degrees, preferably about 90 to about 150 degrees, with a currently most preferred are of contact of 120 to 150 degrees to maximize resin impregnation and heat transfer from roller to substrate.

Rotating roller 4 delivers liquid resin film 5 to a first surface of web 2 passing counter directional thereto. Applicator roller 4 is maintained at a temperature effective to keep resin film 5 in essentially uncured, liquid form. This temperature will vary depending upon the resin, but will generally be within the range of about 50° to about 250° C., preferably about 100° to about 200° C. The speed of rotation of applicator roller 4, the tension in web 2 as it contacts resin film 5, and the speed at which web 2 is advanced to the applicator roller are coordinated to provide good wetout of the web. These specifications can vary widely depending, for example, upon the resin system, the type of web materials, and the heating capacity of the downstream B-staging unit. In general, the speed of rotation of applicator roller 4 will be within the range of about 70 to about 160 percent of web speed, preferably about 100 to about 140 percent of web speed; the tension in web 2 will generally be within the range of about 1 to about 3 pounds per linear inch, preferably about 1.5 to about 2 PLI; and the speed of advancement of the web through the resin application zone will be within the range of about 8 ft/min to about 200 ft/min, preferably 25 to about 125 ft/min.

Resin film 5 is applied to applicator roller 4 by means of resin delivery means, shown here as nozzle 7 capable of applying a controlled quantity of liquid resin to the rotating surface of the applicator roller. Nozzle 7 can be associated with any means for continuous delivery of the resin in liquid form, at either ambient or elevated temperature. Delivery of the resin will be carded out at volume rates synchronized with the speed of the moving web so as to deliver a predetermined volume of resin to the web and to minimize residence time within the resin delivery system. Resin delivery means can include, for example, a temperature-controlled static blender, dynamic mixer or a mixing extruder with an outlet into nozzle 7.

Metering means, shown here as set gap roller 8 located between nozzle 7 and the point of contact of resin film 5 and the advancing web, is used, in conjunction with resin delivery means 7, to control the amount of liquid resin which is delivered to the web. Set gap roller 8 is preferably a smaller-diameter roll than applicator roller 4 rotating counter currently with respect to the rotation of the applicator roller at a rotation speed within the range of about 1 to about 50, preferably about 8 to about 35, percent of the speed of the web. Backflow of resin from the application area can be prevented by positioning the resin deposition area and the set gap roller forward with respect to applicator roll 4, i.e., at an angle β less than 90° with respect to the horizontal radius so that gravitational forces prevent the resin from flowing down the applicator roll in the counterclockwise direction. Movement of resin from the deposition area can be prevented by optional doctor blade 12. Control of the rate at which resin is applied to the web is achieved in the first instance by careful setting of the gap between the set gap roller 8 and the applicator roller 4 so as to maintain a uniform film thickness. Secondly, the rotational speed of the applicator roller is coordinated with web speed so as to achieve transfer of the resin film onto the moving web. In addition, because no backup roller is required to control the contact of the moving web with the applicator roller, control of web tension is maintained to ensure stable operation of the resin application process.

Resin removal means 9, shown here as a scraper or doctor blade, serves to remove from the applicator roller any resin which remains on the roller after contact between resin film 5 and advancing web 2, prior to passage of this remaining resin through a 360° rotation of the roller. The resin removal means is located with respect to the roller and the advancing porous web so that any resin coming in contact therewith is deposited directly onto the porous web prior to contact of the web with the applicator roller.

The wetout of the web by the resin is achieved by pressure-driven flow at the applicator roller 4 and by capillary action within the web. The capillary-induced flow of resin into the web depends upon the viscosity and surface tension of the resin as well as the porosity of the web and surface tension of the web fibers. For impregnation of conventional glass web styles, resin formulations having viscosities within the range of about 0.5 to about 6 poise, typically about one poise, and resin surface tension within the range of about 25 to about 40, typically about 32 dynes/era, can be used. Resin infusion times will vary from about 0.1 second to 0.5 second under typical conditions. For a web speed of 200 ft/min (65 m/rain), for example, the web will move approximately 1.6 ft (0.5 m) in 0.5 seconds.

Figure 2:
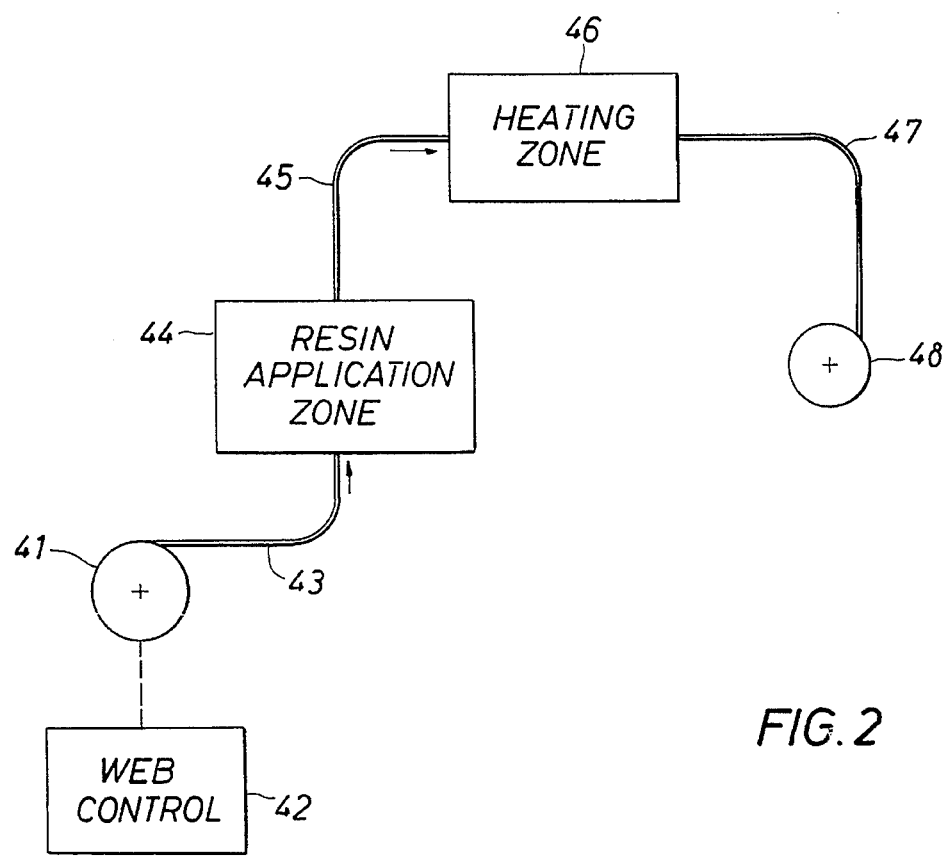
FIG. 2 is a flow diagram of a prepregging process incorporating the invention resin application apparatus.

The prepregging process of the invention can be described in general terms by reference to FIG. 2. Fibrous web 43 is delivered to resin application zone 44 by a suitable automated web advancement system 42 with means for measuring and controlling advancement speed and web tension. Web tension control devices are known in the art. For example, unwind roll 41 can include a brake which, in combination with a front-end dancer roll, maintains a preset web tension programmed into a pull-in unit located between the dancer roll and the resin application zone. Similarly, proper downstream web tension can be maintained by a dancer roll which moderates the speed of a variable-speed constant-diameter roll located downstream from the heating zone.

The fibrous web is advanced through resin application zone 44, which is here shown in a vertical orientation but which can be carried out at an angle with respect to vertical of up to about 45° to enhance wetout of the web. Application zone 44 includes resin delivery means, including a mixing portion for blending the resin and curing system, and temperature control as necessary to maintain the resin system at the desired viscosity. Optional small-diameter conditioning rollers can be used to promote resin penetration of the web after application and before cure.

Resin-saturated web 45 is advanced from the resin application zone to resin cure zone 46, typically a forced air heated treater, wherein the resin-saturated web is heated by exposure to elevated temperature or IR radiation, for example, to partially cure the resin without gelation, a process known as "B-staging." The temperature in the treatment zone will vary depending upon the resin system and the degree of resin cure desired, but will generally be within the range of about 80° to 250° C., preferably about 120° to about 180° C. The resin-saturated web will be subjected to the B-staging treatment for a time sufficient to impart the desired degree of cure, generally about 10 seconds to about 8 minutes. The web is advanced from resin treatment zone 46 in the form of a prepreg 47, which is rolled at uptake roll 48 for storage or, alternatively, is passed directly to lamination.

A laminate is fabricated by subjecting a set of layered prepregs to conditions effective to cure the resin and to integrate the prepregs into a laminated surface. The laminate can optionally include one or more layers of a conductive material such as copper. Laminating conditions generally include a time of about 30 minutes to about 4 hours, preferably about 1 hour to about 2 hours, a temperature of about 160° C. to about 300° C., preferably about 170° C. to about 200° C. and a pressure of about 50 to about 500 psi. The laminate can optionally be "post-cured" by heating at a temperature of about 200 to about 230° C. at ambient pressure for about 1 to 6 hours to improve thermal properties.

Thermosettable resins which can be used in preparing electrical laminates include epoxy resins, imide resins, cyanate resins, propargyl ethers, and blends and reaction products thereof. The currently favored resins, because of their low cost and cured properties, are epoxy resins, alone or blended with a tri- or tetrafunctional epoxy resin.

An epoxy resin-containing laminating composition will include a curing agent. Effective curing agents for epoxy resins are known to include, for example, amines, acids, anhydrides, phenols and imidazoles. The presently preferred curing agents for imparting optimum laminating properties to epoxy compositions are phenolic compounds which have a phenolic functionality greater than about 1.75. The preferred phenolic curing agents are phenolic novolacs prepared by reacting a dihydroxy phenol such as resorcinol or bisphenol-A with formaldehyde in acid solution. The preferred phenolic novolac resin curing agents are bisphenol-A novolacs having a weight per phenolic group of about 60 to about 500, preferably about 60 to about 300, and, on the average, more than about 2 phenolic hydroxyl groups per molecule, preferably about 3 to about 5. Such phenolic novolacs are available under the tradename Epikure® DX-175 from Shell International Chemical Company. The phenolic novolac curing agent will be present in the composition in an amount effective to cure the epoxy resin, which will generally be a stoichiometric amount of about 0.75 to about 1.25 equivalents per equivalent of epoxy resin. In terms of weight percent, the curing agent will be present in an amount generally from about 10 to about 70 weight percent, preferably about 15 to about 50, most preferably about 15 to about 40, based on the combined weight of epoxy resin and curing agent.

The curing agent, for flame-proof applications, can be a mixture of the phenolic resin curing agent and a brominated phenolic curing agent. The brominated phenolic curing agent can be any monomeric or polymeric compound having at least one free phenolic hydroxyl group and one or more bromine atoms on the aromatic ring. Examples of suitable brominated phenolic curing agents include brominated bisphenol-A novolac, brominated phenolic novolac, brominated polyphenylene oxide, brominated bisphenol-A and brominated bisphenol-A carbonate, for example. The brominated bisphenol-A will be present in an amount effective to increase flame retardancy, generally an amount up to about 40 weight percent, usually about 10 to about 30 weight percent, based on the combined weight of epoxy resin and curing agent(s).

In order to promote faster and/or lower temperature cure of the resin components of the composition, an optional cure accelerator may be used. Many suitable accelerators, such as ureas, tertiary amines, imidazoles, phosphenes, octoates and boron trifluorides, for example, are known in the art. The presently preferred class is imidazoles such as 1-methyl imidazole, 2-ethyl imidazole, 2-methyl imidazole, 2-methyl-4-ethyl imidazole and isopropyl imidazole. Because of its availability and performance characteristics, 2-methyl imidazole is the preferred accelerator. The accelerator will be present in the composition in an amount effective to increase the cure rate and/or lower the cure temperature of the composition, generally in an amount from about 0.01 to about 7, preferably from about 0.05 to about 3 weight percent, based on the weight of the composition.

The thermosettable resin system must be designed within certain specifications dictated by the resin application process parameters. The resin formulation must be a liquid at a temperature at which the resin does not undergo cure over the time necessary for application of the resin to the substrate. The resin system must be of sufficiently low viscosity that it achieves good "wetout," or saturation of the web, without the use of a pressure backup roll at the point of application. Once applied to the substrate, however, the resin system must have sufficient viscosity that it does not drop from the resin-containing web before it reaches the heating zone. Resin formulations having viscosities in the range of about 0.5 to about 10 poise, preferably about 0.5 to about 6 poise, are most suitable. The currently preferred resin system is a blend of a diglycidyl ether of bisphenol-A having a WPE of about 175–190, a brominated diglycidyl ether of bisphenol-A having a WPE of about 310–350 and a bromine content of about 30–50 percent, a phenolic novolac curing agent, and 2-methylimidazole accelerator.

The process of the invention can optionally be practiced with a thermosettable resin formulation which includes an aqueous organic solvent or diluent present in an amount effective to decrease the viscosity of the system for ease of processing. Polar organic solvents such as ketones, alcohols and glycol ethers, for example, are suitable. The chosen solvent will generally have a boiling point less than about 160° C. The preferred solvents for epoxy resins are ketones such as acetone, methyl ethyl ketone and methyl isobutyl ketone, for example, and solvent mixtures of these with an alkylene glycol ether such as propylene glycol monomethyl ether. The proportion of solid components in the composition can vary widely depending upon the amount of the other constituents present and the intended application of the composition, but the solvent in a solvent-borne system will generally constitute from about 15 to about 50 weight percent of the total weight of the formulation.

Example 1

This example demonstrates the scrap reduction achieved by the practice of the invention process. In the invention runs, a single-roller resin applicator was used with a web angle of contact of 135 degrees. A doctor blade was positioned with respect to the roller and the advancing glass web so as to scrape unabsorbed resin from the roller onto the web prior to contact of the web with the applicator roller. Comparison runs were run with an identical resin applicator, except that the angle of web contact was 125° and a catch pan was placed below the applicator roller to collect the resin removed by the doctor blade.

Table 1 shows resin scrap under various application conditions for the comparison runs. Use of the invention resin application design resulted in 0 scrap.

TABLE 1

| Run | Line Speed (inches/min) | Pump (rpm) | Total Resin (gms) | Resin Scrap (gms) | % Scrap |
|---|---|---|---|---|---|
| 1 | 200 | 200 | 3630 | 66 | 1.8 |
| 2 | 240 | 200 | 3025 | 102 | 3.4 |
| 3 | 240 | 200 | 3025 | 194 | 6.4 |
| 4 | 240 | 110 | 1650 | 86 | 5.2 |
| 5 | 200 | 200 | 3630 | 95 | 2.6 |
| 6 | 200 | 110 | 1980 | 218 | 11 |
| 7 | 240 | 200 | 3025 | 94 | 3.1 |
| 8 | 200 | 110 | 1980 | 123 | 6.2 |
| 9 | 240 | 192 | 2900 | 0 | 0 |
| 10 | 240 | 110 | 1650 | 0 | 0 |

In the table, pump rpms of 110 and 200 correspond approximately to resin flow rates of 660 and 1210 g/min, respectively. Total resin (g) is calculated for a prepreg length of 50 feet. For example, in run 1, $$50 \text{ ft} \times \frac{1 \text{ minute}}{200 \text{ inch}} \times \frac{12 \text{ inch}}{\text{ft}} \times \frac{1210 \text{ g}}{\text{minute}} = 360 \text{ g}.$$

We claim:

1. In a process for preparing a prepreg in which an essentially uncured liquid-form thermosettable resin is applied to a porous web by depositing the thermosettable resin onto a rotating roller and passing the porous web in countercurrent contact along an arc of contact therewith so as to absorb a major portion of said resin, and the resin-containing web is passed to a heating zone for partial cure of the resin, the improvement which comprises:

removing resin remaining on the rotating roller prior to passage of said remaining resin through a 360° rotation of said roller and causing said remaining resin to fall from said roller directly onto the porous web prior to initial contact of the web along an arc of contact with the rotating roller.

2. The process of claim 1 in which the arc of contact of the porous web on the rotating roller is within the range of about 45 to about 180 degrees.

3. The process of claim 1 in which said porous web comprises glass fibers.

4. The process of claim 1 in which the porous web is advanced to said rotating roller at a speed within the range of about 25 ft/min to about 125 ft/min.

5. The process of claim 1 in which the arc of contact of the porous web on the rotating roller is within the range of about 90 to about 145 degrees.

6. The process of claim 1 in which the rotating roller is maintained at a temperature within the range of about 50° to about 250° C.

7. The process of claim 1 in which the arc of contact of the porous web on the rotating roller is within the range of about 120 to about 150 degrees.

8. The process of claim 1 in which the remaining resin is removed from the rotating roller by contact of said remaining resin with a doctor blade.

9. The process of claim 1 in which the thermosettable resin is an epoxy resin.

* * * * *